US007654637B2

(12) United States Patent
Weaver et al.

(10) Patent No.: US 7,654,637 B2
(45) Date of Patent: Feb. 2, 2010

(54) PHOTOIMAGEABLE NOZZLE MEMBERS AND METHODS RELATING THERETO

(75) Inventors: Sean T. Weaver, Union, KY (US); Rich Wells, Westerville, OH (US)

(73) Assignee: Lexmark International, Inc, Lexington, KY (US)

( * ) Notice: Subject to any disclaimer, the term of this patent is extended or adjusted under 35 U.S.C. 154(b) by 504 days.

(21) Appl. No.: 11/361,732

(22) Filed: Feb. 24, 2006

(65) Prior Publication Data

US 2007/0076060 A1 Apr. 5, 2007

Related U.S. Application Data

(60) Provisional application No. 60/722,766, filed on Sep. 30, 2005.

(51) Int. Cl.
*B41J 2/14* (2006.01)
*G03F 1/00* (2006.01)

(52) U.S. Cl. ........................................ 347/47; 430/320

(58) Field of Classification Search .................. 347/47; 430/320; 156/292

See application file for complete search history.

(56) References Cited

U.S. PATENT DOCUMENTS

| | | | | |
|---|---|---|---|---|
| 4,401,537 | A | 8/1983 | Chern et al. | |
| 4,943,516 | A | 7/1990 | Kamayachi et al. | |
| 5,229,251 | A | 7/1993 | Babich et al. | |
| 5,335,004 | A | 8/1994 | Matsuhisa | |
| 5,730,889 | A | 3/1998 | Miyagawa et al. | |
| 5,986,035 | A | 11/1999 | Inagaki et al. | |
| 6,193,359 | B1 | 2/2001 | Patil et al. | |
| 6,391,523 | B1 | 5/2002 | Hurditch et al. | |
| 6,399,277 | B1 | 6/2002 | Nojima et al. | |
| 6,409,312 | B1 | 6/2002 | Mrvos et al. | |
| 6,440,643 | B1 | 8/2002 | Calistri-Yeh et al. | |
| 6,692,793 | B2 | 2/2004 | Sato et al. | |
| 6,716,568 | B1 | 4/2004 | Minsek et al. | |
| 6,830,646 | B2 * | 12/2004 | Patil et al. | 156/292 |
| 6,881,677 | B1 | 4/2005 | Patil et al. | |
| 2001/0015001 | A1 | 8/2001 | Hashizume | |
| 2002/0132872 | A1 | 9/2002 | Yamamura et al. | |
| 2004/0109048 | A1 | 6/2004 | Fukunaga et al. | |
| 2004/0142272 | A1 | 7/2004 | Song et al. | |
| 2004/0196335 | A1 * | 10/2004 | Stout et al. | 347/64 |
| 2005/0095530 | A1 | 5/2005 | Hosaka et al. | |
| 2005/0147918 | A1 | 7/2005 | Weber et al. | |

FOREIGN PATENT DOCUMENTS

| | | |
|---|---|---|
| EP | 0 488 705 | 6/1992 |

* cited by examiner

*Primary Examiner*—Stephen D Meier
*Assistant Examiner*—Geoffrey Mruk

(57) ABSTRACT

Nozzle members, such as for a micro-fluid ejection head, micro-fluid ejection heads, and a method for making the same. One such nozzle member includes a negative photoresist composition derived from a first di-functional epoxy compound, a relatively high molecular weight polyhydroxy ether, a photoacid generator devoid of aryl sulfonium salts, an adhesion enhancer, and an aliphatic ketone solvent. The nozzle member has a thickness ranging from about 10 microns to about 30 microns.

13 Claims, 7 Drawing Sheets

PHOTOIMAGEABLE NOZZLE MEMBERS AND METHODS RELATING THERETO

CROSS-REFERENCE TO RELATED APPLICATION

This application claims the benefit of U.S. Provisional Application Ser. No. 60/722,766, entitled "Photoimageable Nozzle Members an Ejection Heads, Compositions, and Methods Related Thereto", filed on Sep. 30, 2005.

FIELD OF THE INVENTION

The invention relates to improved photoimageable dry film formulations for use in making nozzle members, such as for micro-fluid ejection heads and to methods for attaching a nozzle member to a substrate for a micro-fluid ejection head having a thick film layer derived from a radiation curable resin formulation.

BACKGROUND AND SUMMARY

Micro-fluid ejection devices, such as ink jet printers continue to evolve as the technology for ink jet printing continues to improve to provide higher speed, higher quality printers. However, the improvement in speed and quality does not come without a price. The micro-fluid ejection heads are more costly to manufacture because of tighter alignment tolerances.

For example, some conventional micro-fluid ejection heads were made with nozzle plates (a form of a nozzle member) containing flow features. The nozzle plates were then aligned, and adhesively attached to a semiconductor substrate. However, minor imperfections in the substrate or nozzle plate components of the ejection head or improper alignment of the parts has a significant impact on the performance of the ejection heads.

One advance in providing improved micro-fluid ejection heads is the use of a photoresist layer applied to a device surface of the semiconductor substrate as a thick film layer. The thick film layer is imaged to provide flow features for the micro-fluid ejection heads. Use of the imaged thick film layer enables more accurate alignment between the flow features and ejection actuators on the device surface of the substrate.

While the use of an imaged photoresist layer improves alignment of the flow features to the ejection actuators, there still exist alignment problems and difficulties associated with a nozzle plate attached to the thick film layer. Misalignment between the ejection actuators and corresponding nozzles (e.g., holes) in a nozzle plate has a disadvantageous effect on the accuracy of fluid droplets ejected from the nozzles when the nozzles are formed in the nozzle plate before attaching the nozzle plate to the thick film layer. Ejector actuator and nozzle alignment also has an effect on the mass and velocity of the fluid droplets ejected through the nozzles.

Conventional nozzle plates were made from metal or a polyimide material that was laser ablated then adhesively attached to the thick film layer. Use of such nozzle plates require an alignment step to assure that the nozzles correspond with the fluid ejector actuators and flow features in the thick film layer. In order to eliminate such alignment steps, photoimageable nozzle plate materials may be applied to the thick film layer by spin coating or lamination techniques. Spin coating techniques may be used to apply the nozzle plate photoresist material to the thick film layer before the flow features are developed in the thick film layer. However, developing the flow features in the thick film layer after applying the nozzle plate materials to the thick film layer requires difficult processing techniques.

In the alternative, lamination techniques may be used to apply the nozzle plate materials to an imaged and developed thick film layer. However, conventional photoresist materials are available only as a relatively thick photoresist layer having a thickness of from about 35 to about 80 microns. Such relatively thick photoresist materials are too thick for use in providing a suitable photoimageable nozzle plate for a micro-fluid ejection head. If the photoresist materials are screened down to an appropriate thickness, the resulting photoresist films becomes too brittle to handle and apply by a lamination process to the thick film layer.

Accordingly, there is a need for, for example, improved photoresist or photoimageable materials that may be used as nozzle materials that may be laminated adjacent a thick film layer of a micro-fluid ejection head structure.

Amongst other embodiments of the present invention, there is provided a nozzle member for a micro-fluid ejection head, a micro-fluid ejection head containing an improved nozzle member, and a method for making a micro-fluid ejection head. One such nozzle member includes a negative photoresist composition derived from a first di-functional epoxy compound, a relatively high molecular weight polyhydroxy ether, a photoacid generator devoid of aryl sulfonium salts, an adhesion enhancer, and an aliphatic ketone solvent. The nozzle member has a thickness ranging from about 10 microns to about 30 microns.

In another embodiment, there is provided a method for making an improved micro-fluid ejection head. The method includes applying a first negative photoresist layer adjacent a device surface of a substrate. The first negative photoresist layer is derived from a composition including a multi-functional epoxy compound, a first di-functional epoxy compound, a photoacid generator devoid of aryl sulfonium salts, an adhesion enhancer, and an aryl ketone solvent. A plurality of flow features are imaged in the first photoresist layer. The imaged first photoresist layer is developed to provide the plurality of flow features therein and a substantially planar thick film layer surface. A second negative photoresist layer is applied adjacent the thick film layer. The second negative photoresist layer has a thickness ranging from about 10 to about 30 microns and is derived from a second photoresist formulations including the first di-functional epoxy compound, a relatively high molecular weight polyhydroxy ether, the photoacid generator devoid of aryl sulfonium salts, the adhesion enhancer, and an aliphatic ketone solvent. A plurality of nozzles are imaged in the second photoresist layer. The imaged second photoresist layer is developed to provide a photoresist nozzle member adjacent the thick film layer.

In yet another embodiment, there is provided a micro-fluid ejection head including a substrate having a device surface. The ejection head includes a photoimaged and developed thick film layer applied adjacent the device surface of the substrate. The thick film layer is provided by a first negative photoresist layer derived from a composition including a multi-functional epoxy compound, a first di-functional epoxy compound, a photoacid generator devoid of aryl sulfonium salts, an adhesion enhancer, and an aryl ketone solvent. A photoimaged and developed nozzle member is adjacent the imaged and developed thick film layer. The photoimaged and developed nozzle member is a second photoresist layer derived from a composition including the first di-functional epoxy compound, a second di-functional epoxy compound, a relatively high molecular weight polyhydroxy ether, the photoacid generator devoid of aryl sulfonium salts, the adhesion enhancer, and an aliphatic ketone solvent. The nozzle member has a thickness ranging from about 10 microns to about 30 microns.

An advantage of at least some of the exemplary embodiments described herein is that lamination of a dry film photoresist layer adjacent a substrate and thick film layer for a micro-fluid ejection head enables wafer level processing of the ejection head. Wafer level processing means that separate processing steps for the nozzle member and the substrate may be eliminated in favor of photoimaging and developing a composite substrate containing materials providing the flow features and nozzles. Accordingly, laser ablation steps for the nozzle member as well as alignment tolerances, adhesives, and/or thermal compression bonding techniques used to attach the nozzle member to the substrate are avoided. Other potential benefits of the disclosed embodiments include reduction in raw materials required, potential improvement in ejection head performance, improvement in adhesion and durability of the composite substrate and nozzle member structure, and significant manufacturing cost savings.

For purposes of the disclosure, "difunctional epoxy" means epoxy compounds and materials having only two epoxy functional groups in the molecule, "Multifunctional epoxy" means epoxy compounds and materials having more than two epoxy functional groups in the molecule.

BRIEF DESCRIPTION OF THE DRAWINGS

Further advantages of the exemplary embodiments will become apparent by reference to the detailed description when considered in conjunction with the figures, which are not to scale, wherein like reference numbers indicate like elements through the several views, and wherein.

DETAILED DESCRIPTION OF EXEMPLARY EMBODIMENTS

Figure 1:
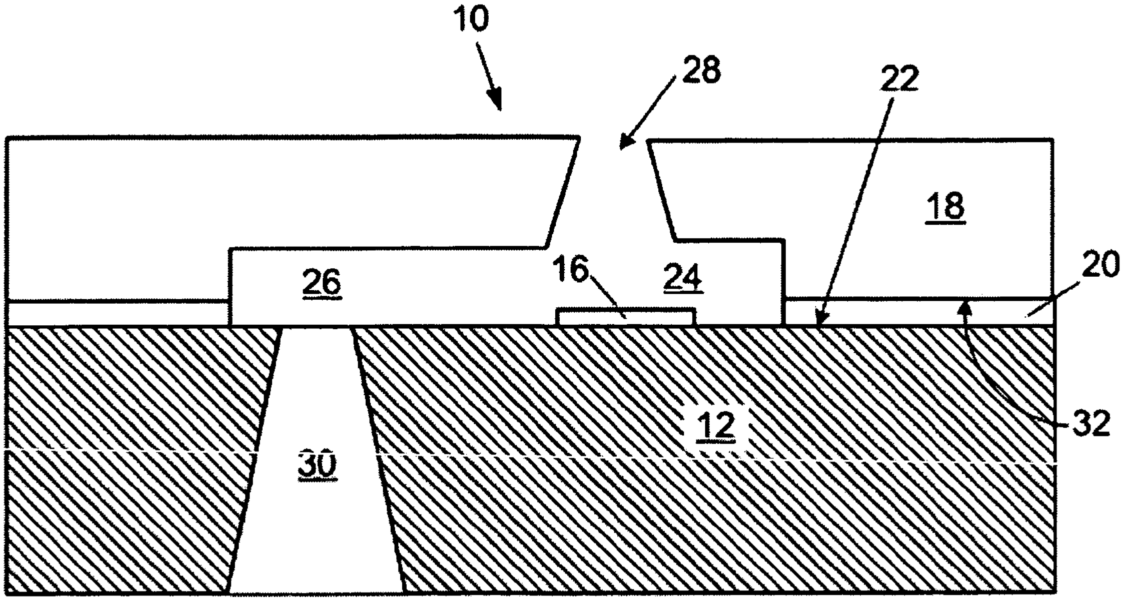
FIG. 1 Prior Art
FIG. 1 is a cross-sectional view, not to scale, of a portion of a prior art micro-fluid ejection head.

With reference to FIG. 1, there is shown, in partial cross-sectional view, a portion of a prior art micro-fluid ejection head 10. The micro-fluid ejection head 10 includes a semiconductor substrate 12 containing various insulative, conductive, resistive, and passivating layers providing a fluid ejector actuator 16.

In a prior art micro-fluid ejection head 10, a nozzle plate 18 is attached as by an adhesive 20 to a device surface 22 of the semiconductor substrate 12. In such micro-fluid ejection head 10, the nozzle plate 18 is made out of a laser ablated materials such as polyimide. The polyimide material is laser ablated to provide a fluid chamber 24 in fluid flow communication with a fluid supply channel 26. Upon activation of the ejector actuator, fluid is expelled through a nozzle 28 that is also laser ablated in the polyimide material of the nozzle plate 18. The fluid chamber 24 and fluid supply channel 26 are collectively referred to as "flow features." A fluid feed slot 30 is etched in the substrate 12 to provide fluid via the fluid supply channel 26 to the fluid chamber 24.

In order to provide the laser ablated nozzle plate 18, the polyimide material is laser ablated from a flow feature side 32 thereof before the nozzle plate 18 is attached to the semiconductor substrate 12. Accordingly, misalignment between the flow features in the nozzle plate 18 and the fluid ejector actuator 16 may be detrimental to the functioning of the micro-fluid ejection head 10.

Figure 2:
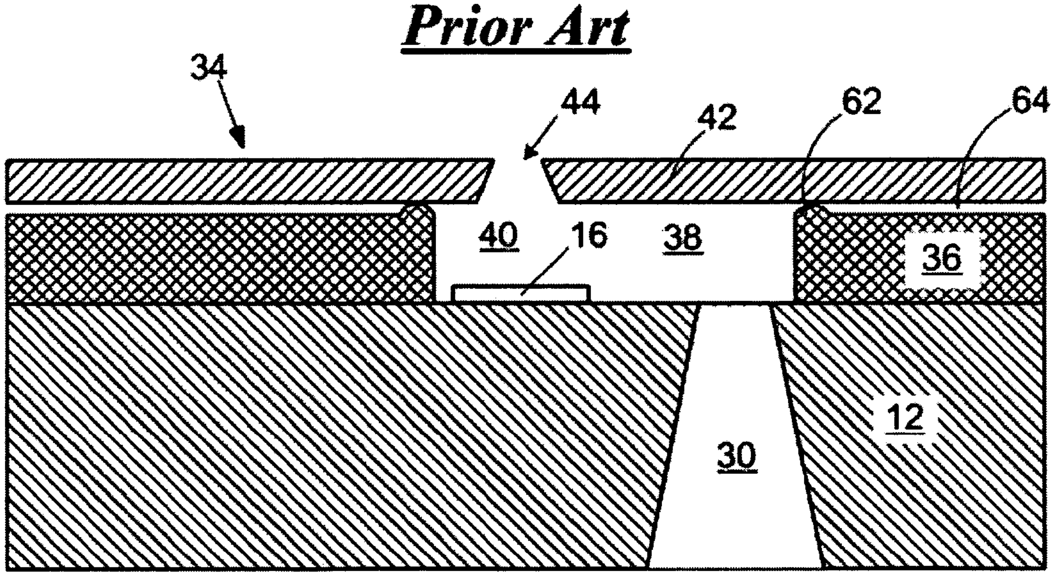
FIG. 2 Prior Art
FIG. 2 is a cross-sectional view, not to scale, of a portion of another micro-fluid ejection head containing a prior art thick film layer.

Another prior art micro-fluid ejection head 34 is illustrated in FIG. 2. In this prior art micro-fluid ejection head 34, a thick film layer 36 provides the flow features, i.e., a fluid supply channel 38 and a fluid chamber 40 for providing fluid to the fluid ejector actuator 16. In such an ejection head 34, the thick film layer 36 is a photoresist material that is spin coated onto the device surface 22 of the substrate 12. The photoresist material is then imaged and developed using conventional photoimaging techniques to provide the flow features. A separate nozzle member, such as plate 42 containing only nozzles, such as nozzle 44, is then attached to the thick film layer 36 as by thermal compression bonding or by use of an adhesive. As in FIG. 1, the nozzle plate 42 may be made of a laser ablated polyimide material that is laser ablated before attaching the nozzle plate 42 to the thick film layer 36.

Figure 3:
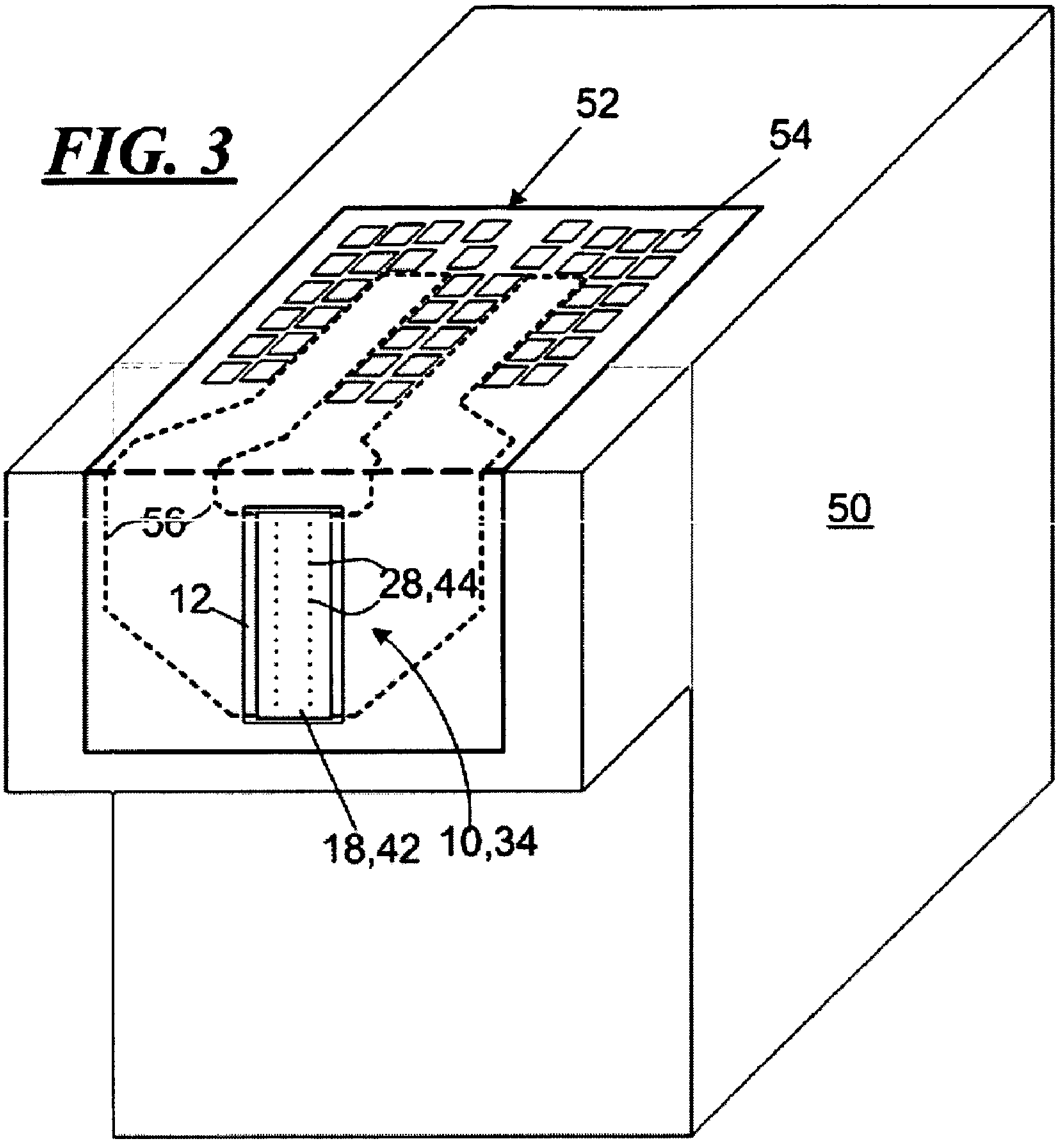
FIG. 3 is a perspective view, not to scale, of a fluid cartridge containing a micro-fluid ejection head.
Figure 4:
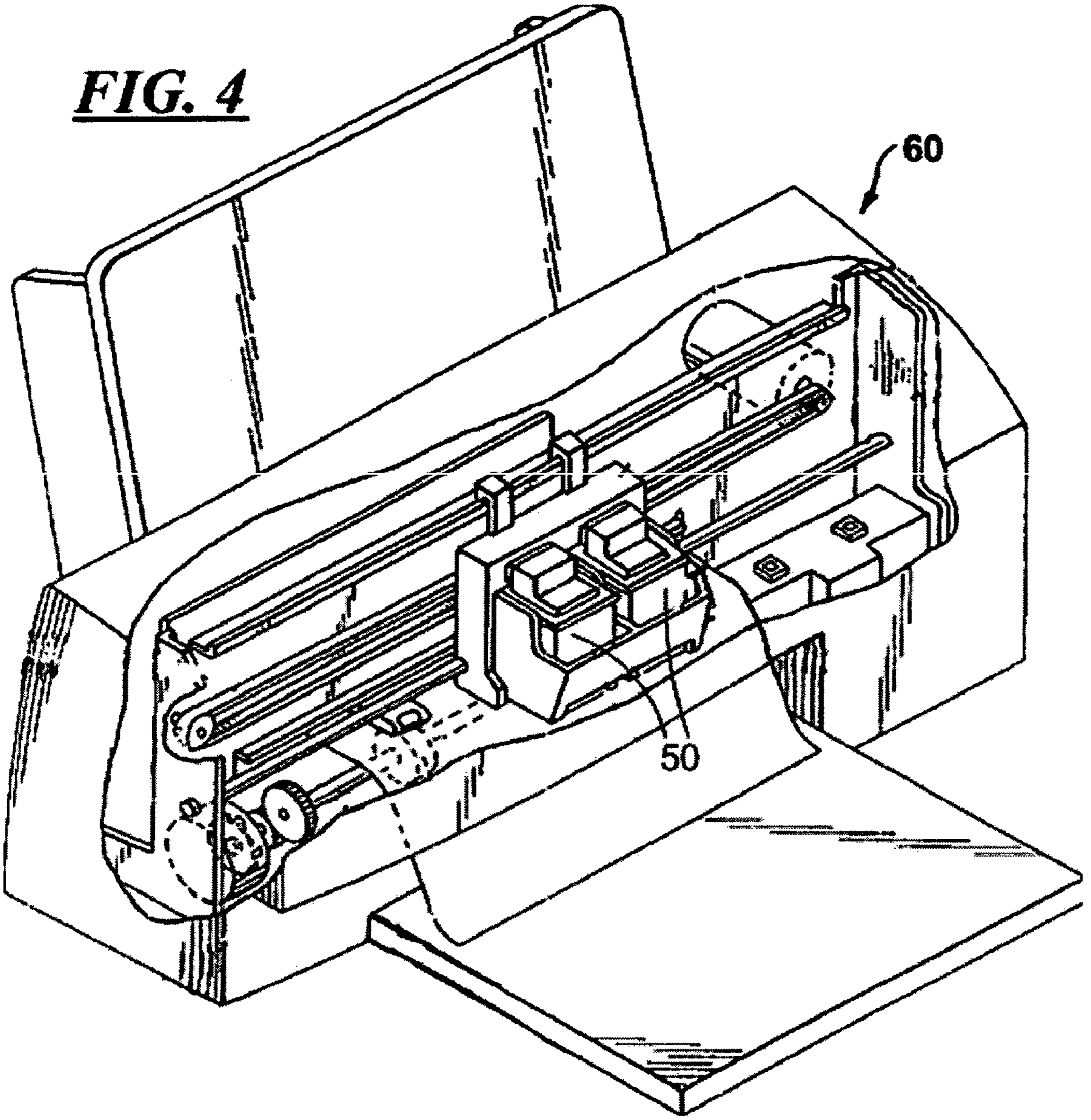
FIG. 4 is a perspective view, not to scale, of a micro-fluid ejection device.

The microfluid ejection head 10 or 34 may be attached to a fluid supply reservoir 50 as illustrated in FIG. 3. The fluid reservoir 50 includes a flexible circuit 52 containing electrical contacts 54 thereon for providing control and actuation of the fluid ejector actuators 16 on the substrate 12 via conductive traces 56. One or more reservoirs 50 containing the ejection heads 10 or 34 may be used in a micro-fluid ejection device 60, such as an ink jet printer as shown in FIG. 4 to provide control and ejection of fluid from the ejection heads 10 or 34.

Referring again to FIG. 2, while the thick film layer 36 enables more accurate alignment of the flow features with the ejector actuator 16, conventional photoresist materials for providing the thick film layer 36 may develop cracks and/or imperfections such as non-planar areas 62 (FIG. 2) which may create gaps 64 or otherwise reduce adhesion between the nozzle plate 42 and the thick film layer 36. Such reduced adhesion may lead to delamination of the nozzle plate 42 from the thick film layer. Additionally, the gaps 64 caused by the raised areas 62 may cause misalignment or distortion of the nozzles 44 thereby resulting in poor performance of the ejection head 34.

Figure 5:
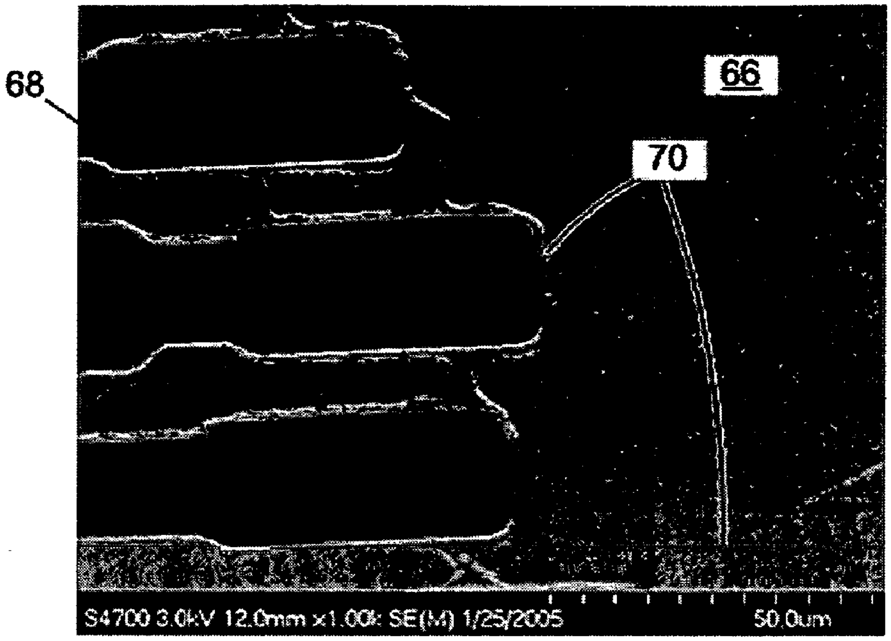
FIG. 5 Prior Art
FIG. 5 is a photomicrograph of a prior art thick film layer after imaging and developing.
Figure 6:
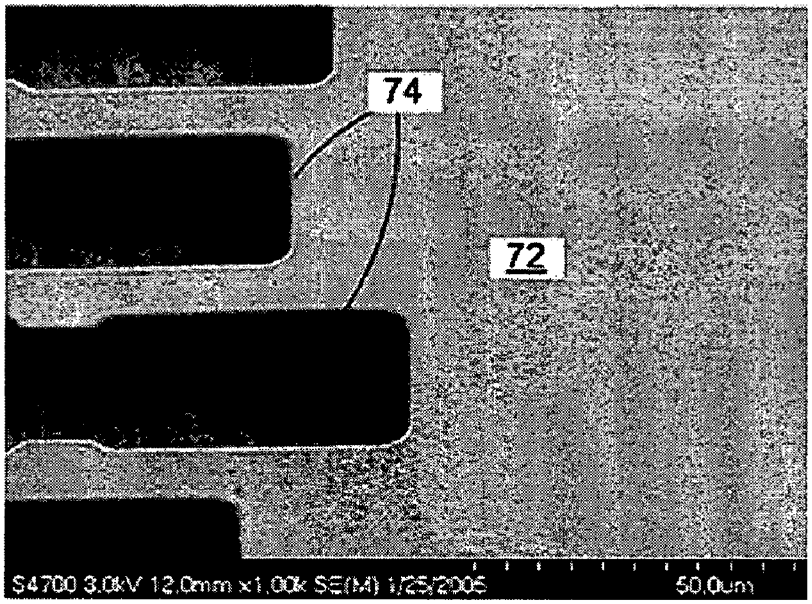
FIG. 6 is a photomicrograph of a thick film layer according to one embodiment in the disclosure after imaging and developing.

FIG. 5 is a photomicrograph of a portion of a thick film layer 66 made with a prior art photoresist formulation. Upon imaging and developing the thick film layer 66 to provide the flow features 68, imperfections 70 develop in the thick film layer 66. By comparison, a thick film layer 72 made according to an embodiment of the disclosure is much improved in planarity and has much more well-defined flow features 74 without the imperfections 70 of the prior art photoresist material.

A photoresist formulation that provides an improved thick film layer 80 (FIG. 7) includes a multi-functional epoxy compound, a first di-functional epoxy compound, a photoacid generator, and, optionally, an adhesion enhancing agent. A suitable first multifunctional epoxy component for making the photoresist formulation according to one embodiment of the disclosure, may be selected from aromatic epoxides such as glycidyl ethers of polyphenols. An exemplary first multi-functional epoxy resin is a polyglycidyl ether of a phenol-formaldehyde novolac resin such as a novolac epoxy resin having an epoxide gram equivalent weight ranging from about 190 to about 250 and a viscosity at 130° C. ranging from about 10 to about 60 poise which is available from Resolution Performance Products of Houston, Tex. under the trade name EPON RESIN SU-8.

The first multi-functional epoxy component of the photoresist formulation has a weight average molecular weight of about 3,000 to about 5,000 Daltons as determined by gel permeation chromatography, and an average epoxide group functionality of greater than 3, preferably from about 6 to about 10. The amount of multifunctional epoxy resin in an exemplary photoresist formulation for the thick film layer 80 can range from about 30 to about 50 percent by weight based on the weight of the cured thick film layer 80.

A second component of the photoresist formulation for the thick film layer 80 is the first di-functional epoxy compound. The first di-functional epoxy component may be selected from di-functional epoxy compounds which include diglycidyl ethers of bisphenol-A (e.g. those available under the trade designations "EPON 1007F", "EPON 1007" and "EPON 1009F", available from Shell Chemical Company of Houston, Tex., "DER-331", "DER-332", and "DER-334", available from Dow Chemical Company of Midland, Mich., 3,4-epoxycyclohexylmethyl-3,4-epoxycyclohexene carboxylate (e.g. "ERL-4221" available from Union Carbide Corporation of Danbury, Conn., 3,4-epoxy-6-methylcyclohexylmethyl-3,4-epoxy-6-methylcyclohexene carboxylate (e.g. "ERL-4201" available from Union Carbide Corporation), bis(3,4-epoxy-6-methylcyclohexylmethyl) adipate (e.g. "ERL-4289" available from Union Carbide Corporation), and bis(2,3-epoxycyclopentyl)ether (e.g. "ERL-0400" available from Union Carbide Corporation.

An exemplary first di-functional epoxy component is a bisphenol-A/epichlorohydrin epoxy resin available from Shell Chemical Company of Houston, Tex. under the trade name EPON resin 1007F having an epoxide equivalent of greater than about 1000. An "epoxide equivalent" is the number of grams of resin containing 1 gram-equivalent of epoxide. The weight average molecular weight of the first di-functional epoxy component is typically above 2500 Daltons, e.g., from about 2800 to about 3500 weight average molecular weight. The amount of the first di-functional epoxy component in the thick film photoresist formulation may range from about 30 to about 50 percent by weight based on the weight of the cured resin.

The photoresist formulation for the thick film layer 80 also includes a photoacid generator devoid of aryl sulfonium salts. An exemplary photoacid generator is a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist formulation for the thick film layer 80 in an amount ranging from about 5 to about 15 weight percent based on the weight of the cured resin.

Of the aromatic complex salts which are suitable for use in exemplary photoresist formulation disclosed herein, suitable salts are di- and triaryl-substituted iodonium salts. Examples of aryl-substituted iodonium complex salt photoacid generates include, but are not limited to:

diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)-phenyliodonium p-toluenesulfonate, bis(4-tert-butylphenyl)iodonium hexafluorophosphate, and diphenyliodonium hexafluoroantimonate.

An exemplary iodonium salt for use as a photoacid generator for the embodiments described herein is a mixture of diaryliodonium hexafluoroantimonate salts, commercially available from Sartomer Company, Inc. of Exton, Pa. under the trade name SARCAT CD 1012

The photoresist formulation for the thick film layer 80 may optionally include an effective amount of an adhesion enhancing agent such as a silane compound. Silane compounds that are compatible with the components of the photoresist formulation typically have a functional group capable of reacting with at least one member selected from the group consisting of the multifunctional epoxy compound, the difunctional epoxy compound and the photoinitiator. Such an adhesion enhancing agent may be a silane with an epoxide functional group such as a glycidoxyalkyltrialkoxysilane, e.g., gamma-glycidoxypropyltrimethoxysilane. When used, the adhesion enhancing agent can be present in an amount ranging from about 0.5 to about 2 weight percent, such as from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the thick film layer 80 adjacent the device surface 22 of the substrate 12.

In order to provide the thick film layer 80 adjacent (e.g., on) the device surface 22 of a substrate, such as semiconductor substrate 12 (FIG. 7), a suitable solvent is used. An exemplary solvent is a solvent which is non-photoreactive. Non-photoreactive solvents include, but are not limited gamma-butyrolactone, $C_{1-6}$ acetates, tetrahydrofuran, low molecular weight ketones, mixtures thereof and the like. An exemplary non-photoreactive solvent is acetophenone. The non-photoreactive solvent is present in the formulation mixture used to provide the thick film layer 80 in an amount ranging from about 20 to about 90 weight percent, such as from about 40 to about 60 weight percent, based on the total weight of the photoresist formulation. In an exemplary embodiment, the non-photoreactive solvent does not remain in the cured thick film layer 80 and is thus removed prior to or during the thick film layer 80 curing steps.

According to an exemplary procedure, non-photoreactive solvent and first di-functional epoxy compound are mixed together in a suitable container, such as an amber bottle or flask, and the mixture is put in a roller mill overnight at about 60° C. to assure suitable mixing of the components. After mixing the solvent and the first di-functional epoxy compound, the multi-functional epoxy compound is added to the container and the resulting mixture is rolled for two hours on a roller mill at about 60° C. The other components, the photoacid generator and the adhesion enhancing agent, are also added one at a time to the container and the container is rolled for about two hours at about 60° C. after adding all of the components to the container to provide a wafer coating mixture.

In addition to being devoid of sulfonium salts, the photoresist formulation and resulting thick film layer 80 are substantially devoid of acrylate or methacylate polymers and nitrile groups. Without desiring to be bound by theory, it is believed that the higher molecular weight difunctional epoxy material contributes sufficient thermoplastic properties to the thick film layer 80 to enable use of a photocurrable formulation that is substantially devoid of acrylate or methacrylate polymers and nitrile rubber components. Additionally, a photoresist formulation, substantially devoid of acrylate or methacrylate polymers, may have an increased shelf life as compared to the same photoresist formulation containing acrylate or methacrylate polymers.

A method for making a photoimaged thick film layer 80 will now be described with reference to FIGS. 7-9. In order to apply the photoresist formulation described above adjacent (e.g., to) the device surface 22 of the substrate 12 (FIG. 7), a silicon substrate wafer can be centered on an appropriate sized chuck of either a resist spinner or conventional wafer resist deposition track. The photoresist formulation mixture is either dispensed by hand or mechanically into the center of the wafer. The chuck holding the wafer is then rotated at a predetermined number of revolutions per minute to evenly spread the mixture from the center of the wafer to the edge of the wafer. The rotational speed of the wafer may be adjusted or the viscosity of the coating mixture may be altered to vary the resulting resin film thickness. Rotational speeds of 2500 rpm or more may be used. The amount of photoresist formulation applied adjacent device surface 22 should be sufficient to provide the thick film layer 80 having the desired thickness for flow features imaged therein. Accordingly, the thickness of layer 80 after curing may range from about 10 to about 25 microns or more.

The resulting silicon substrate wafer having the thick film layer 80 is then removed from the chuck either manually or mechanically and placed on either a temperature controlled hotplate or in a temperature controlled oven at a temperature of about 90° C. for about 30 seconds to about 1 minute until the material is "soft" baked. This step removes at least a portion of the solvent from the thick film layer 80 resulting in a partially dried film adjacent the device surface 22 of the substrate 12. The wafer is removed from the heat source and allowed to cool to room temperature.

In order to define flow features in the thick film layer 80 such as a fluid chamber 82 and fluid supply channel 84, the layer 80 is masked with a mask 86 containing substantially transparent areas 88 and substantially opaque areas 90 thereon. Areas of the thick film layer 80 masked by the opaque areas 90 of the mask 86 will be removed upon developing to provide the flow features described above.

Figure 7:
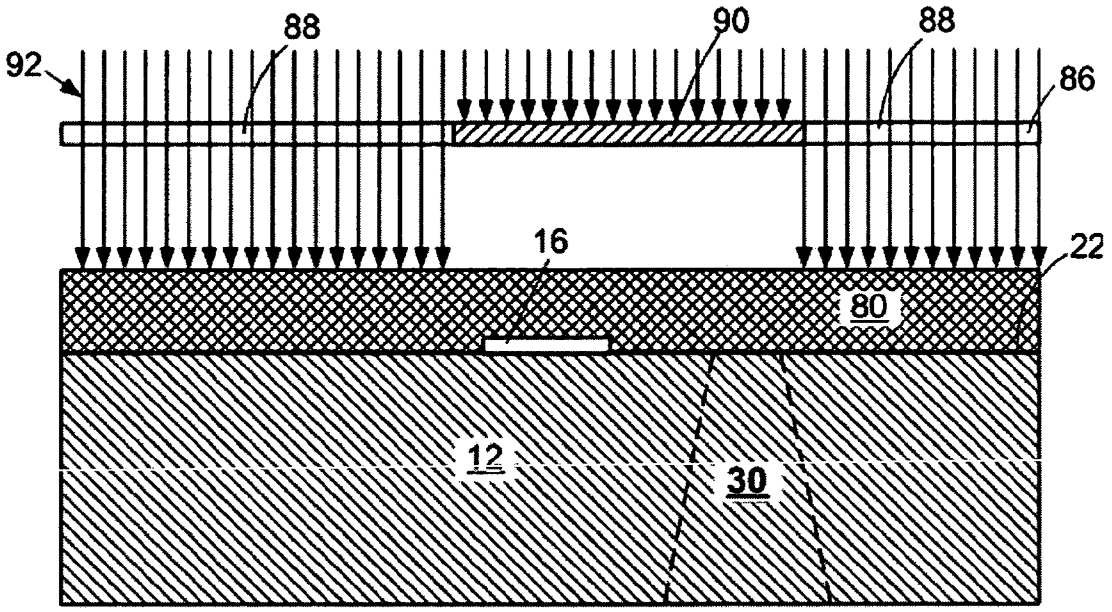
FIGS. 7-8 are schematic views of a process for imaging a thick film layer according to an embodiment of the disclosure.

In FIG. 7, a radiation source provides actinic radiation indicated by arrows 92 to image the thick film layer 80. A suitable source of radiation emits actinic radiation at a wavelength within the ultraviolet and visible spectral regions. Exposure of the thick film layer 80 may be from less than about 1 second to 10 minutes or more, such as from about 5 seconds to about one minute, depending upon the amounts of particular epoxy materials and aromatic complex salts being used in the formulation and depending upon the radiation source, distance from the radiation source, and the thickness of the thick film layer 80. The thick film layer 80 may optionally be exposed to electron beam irradiation instead of ultraviolet radiation.

The foregoing procedure is similar to a standard semiconductor lithographic process. The mask 86 is a clear, flat substrate usually glass or quartz with opaque areas 90 defining the areas to be removed from the layer 80 (i.e. a negative acting photoresist layer 80). The opaque areas 90 prevent the ultraviolet light from cross-linking the layer 80 masked beneath it. The exposed areas of the layer 80 provided by the substantially transparent areas 88 of the mask 86 are subsequently baked at a temperature of about 90° C. for about 30 seconds to about 10 minutes, such as from about 1 to about 5 minutes to complete the curing of the thick film layer 80.

Figure 8:
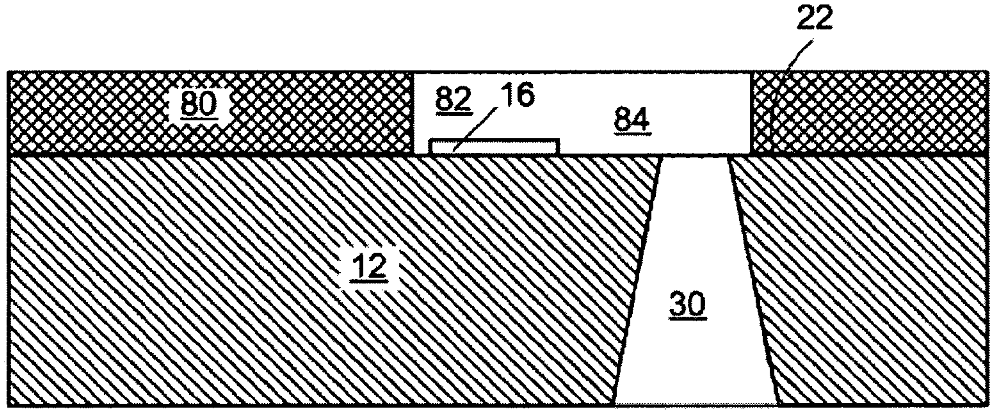
Figure 9:
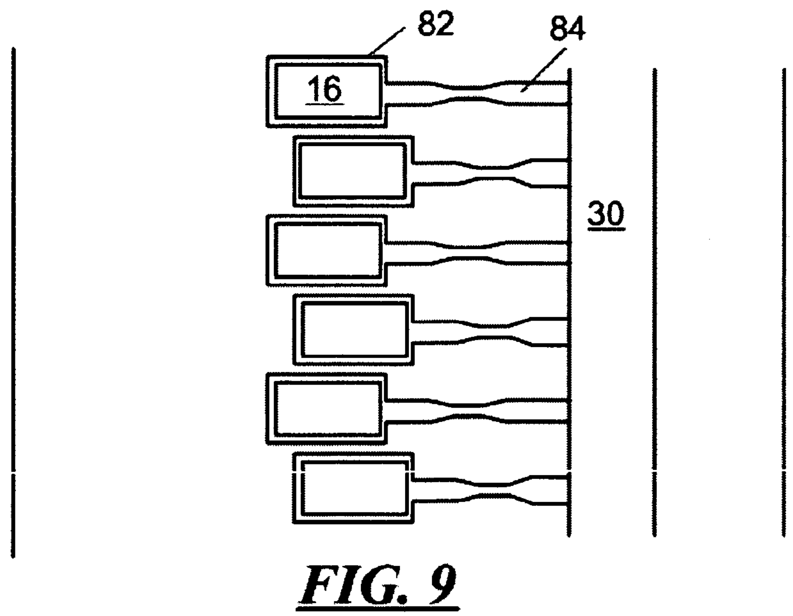
FIG. 9 is a partial plan view of a thick film layer after imaging on a semiconductor substrate.

The non-imaged areas of the thick film layer 80 are then solubilized by a developer and the solubilized material is removed leaving the imaged and developed thick film layer 80 adjacent the device surface 22 of the substrate 12 as shown in FIG. 8 and in plan view in FIG. 9. The developer comes in contact with the substrate 12 and thick film layer 80 through either immersion and agitation in a tank-like setup or by spraying the developer on the substrate 12 and thick film layer 80. Either spray or immersion will adequately remove the non-imaged material. Illustrative developers include, for example, butyl cellosolve acetate, a xylene and butyl cellosolve acetate mixture, and $C_{1-6}$ acetates like butyl acetate.

Figure 10:
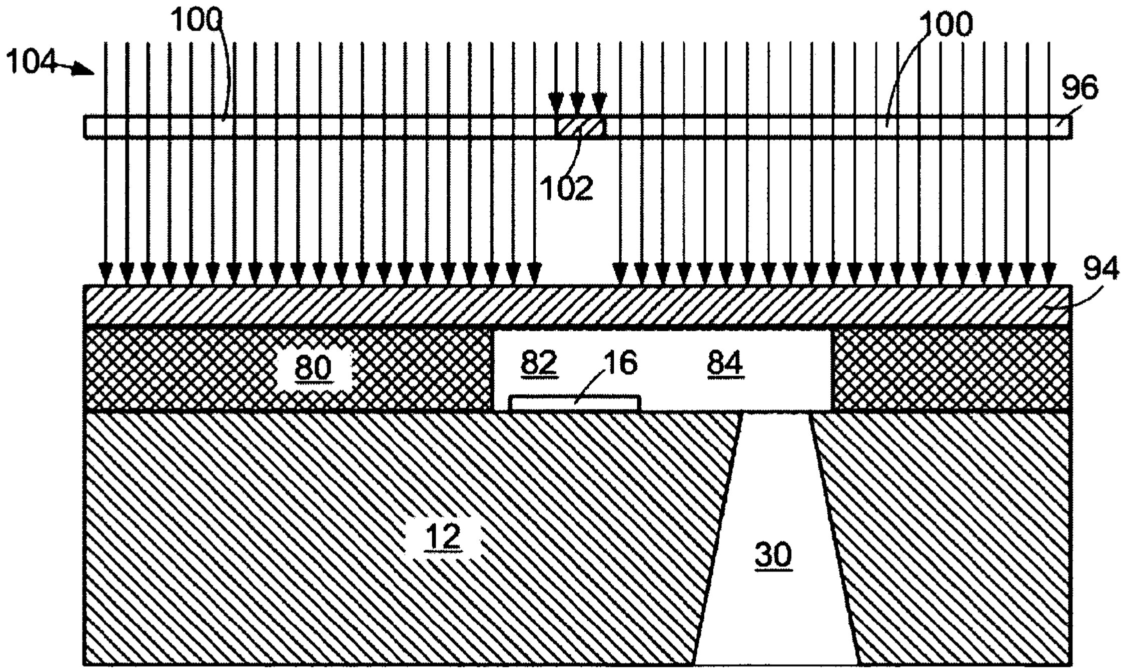
FIG. 10 is a schematic view of a process for imaging a second photoresist layer providing a nozzle plate on a thick film layer of a substrate.

With reference now to FIG. 10, subsequent to imaging and developing the thick film layer 80, a second photoresist layer 94 is laminated adjacent (e.g., to) the thick film layer 80. The second photoresist layer 94 is provided by a dry film photoresist material derived from a di-functional epoxy compound, a relatively high molecular weight polyhydroxy ether, the photoacid generator described above, and, optionally, the adhesion enhancing agent described above.

The di-functional epoxy compound used for providing the second photoresist layer 94, includes the first di-functional epoxy compound described above, having a weight average molecular weight typically above 2500 Daltons, e.g., from about 2800 to about 3500 weight average molecular weight in Daltons.

In order to enhance the flexibility of the second photoresist layer 94 for lamination purposes, a second di-functional epoxy compound may be included in the formulation for the second photoresist layer. The second di-functional epoxy compound typically has a weight average molecular weight of less than the weight average molecular weight of the first di-functional epoxy compound. In particular, the weight average molecular weight of the second di-functional epoxy compound ranges from about 250 to about 400 Daltons. Substantially equal parts of the first di-functional epoxy compound and the second di-functional epoxy compound are used to make the second photoresist layer 94. A suitable second di-functional epoxy compound may be selected from diglycidyl ethers of bisphenol-A available from DIC Epoxy Company of Japan under the trade name DIC 850-CRP and from Shell Chemical of Houston, Tex. under the trade name EPON 828. The total amount of di-functional epoxy compound in the second photoresist layer 94 ranges from about 40 to about 60 percent by weight based on the total weight of the cured photoresist layer 94. Of the total amount of di-functional epoxy compound in the photoresist layer 94, about half of the total amount is the first di-functional epoxy compound and about half of the total amount is the second di-functional epoxy compound.

Another component of the second photoresist layer 94 is a relatively high molecular weight polyhydroxy ether compound of the formula:

$$[OC_6H_4C(CH_3)_2C_6H_4OCH_2CH(OH)CH_2]_n$$

having terminal alpha-glycol groups, wherein n is an integer from about 35 to about 100. Such compounds are made from the same raw materials as epoxy resins, but contain no epoxy groups in the compounds. Such compounds are often referred to as phenoxy resins. Examples of suitable relatively high molecular weight phenoxy resins include, but are not limited to, phenoxy resins available from InChem Corporation of Rock Hill, S.C. under the trade names PKHP-200 and PKHJ. Such phenoxy compounds have a solids content of about 99 weight percent, a Brookfield viscosity at 25° C. ranging from about 450 to about 800 centipoise, a weight average molecular weight in Daltons ranging from about 50,000 to about 60,000, a specific gravity, fused at 25° C., of about 1.18, and a glass transition temperature of from about 90° to about 95° C.

Phenoxy resins are particularly useful in making the second photoresist layer 94, partially because they often do not crystallize or build up stress concentrations. Phenoxy resins have high temperature characteristics that enable stability over a wide temperature range including temperatures above about 38° C. The second photoresist layer 94 contains from about 25 to about 35 percent by weight phenoxy resin based on the weight of the cured second photoresist layer 94

As with the photoresist material for the thick film layer 80, the second photoresist layer 94 includes the photoacid generator described above, and, optionally, the adhesion enhancing agent described above. The amount of the photoacid generator ranges from about 15 to about 20 by weight based on the weight of the cured photoresist layer 94, and the adhesion enhancing agent, when used, ranges from about 0.05 to about 1 percent by weight based on the weight of the cured second photoresist layer 94.

As set forth above, the second photoresist layer 94 is applied as a dry film laminate adjacent the thick film layer 80. Accordingly, the foregoing components of the second photoresist layer may be dissolved in a suitable solvent or mixture of solvents and dried on a release liner or other suitable support material. A solvent in which all of the components of the second photoresist layer are soluble is an aliphatic ketone solvent or mixture of solvents. A particularly useful aliphatic ketone solvent is cyclohexanone. Cyclohexanone may be used alone or, as in an exemplary embodiment, in combination with acetone. Cyclohexanone is used as the primary solvent for the second photoresist composition due to the solubility of the high molecular weight phenoxy resin in cyclohexanone. Acetone is optionally used as a solvent to aid the film formation process. Since acetone is highly volatile solvent it eludes off quickly after the film has been drawn down onto a release liner or support material. Volatilization of the acetone helps solidify the liquid resin into a dry film.

A suitable formulation for providing the second photoresist layer 94 is as follows:

TABLE 1

| Component | Amount in photoresist formulation (wt. %) |
|---|---|
| First di-functional epoxy component (EPON 1007F) | 9.6 |
| Second di-functional epoxy component (DIC 850 CRP) | 9.6 |
| Polyhydroxy ether (InChem PKHJ) | 12.8 |
| Diaryliodoniumhexafluoroantimonate (SARCAT 1012) | 7.2 |
| Glycidoxypropyltrimethoxysilane (Z-6040) | 0.3 |
| Cyclohexanone | 50 |
| Acetone | 10.5 |

According to an exemplary embodiment, such a formulation is capable of providing a photoresist layer 94 that can provide a nozzle member having a thickness ranging from about 10 microns to about 30 microns. Such a formulation may also be used to provide a photoresist layer 94 that has a resolution of greater than about 10 microns (e.g., about 6 microns), an aspect ratio of less than about 2:1, such as about 5:1, and film properties (b-staged) of: 1) about 20% to about 200% elongation (e.g., about 50% to about 100%) and 2) a Young's Modulus of about 10 to about 500 MPa (e.g., about 20 to about 100 MPa).

Figure 11:
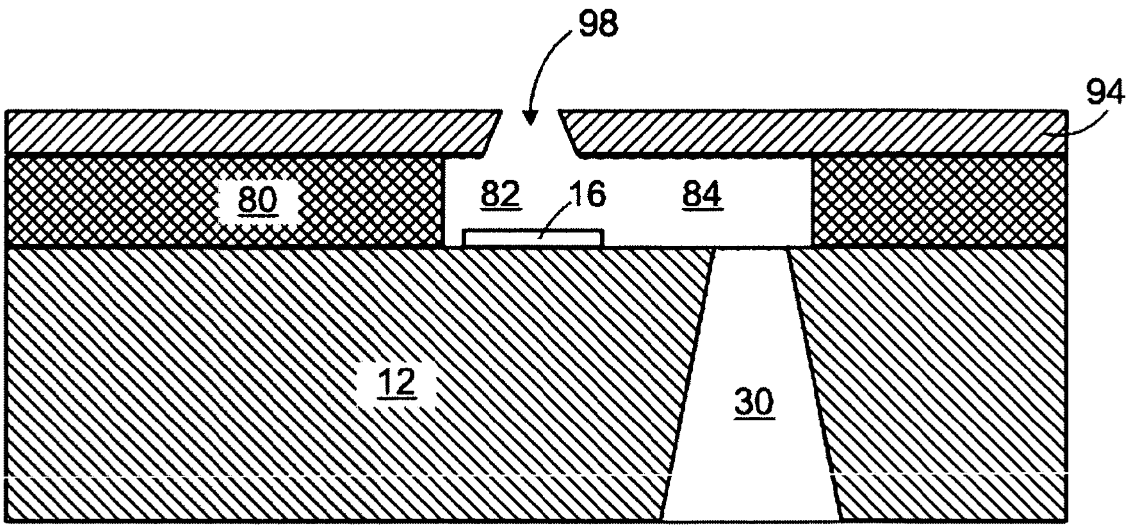
FIG. 11 cross-sectional view, not to scale, of a portion of a micro-fluid ejection head according to one embodiment of the disclosure containing a nozzle plate laminated to a thick film layer.

With reference to FIGS. 10 and 11, a method for making a micro-fluid ejection head containing the second photoresist layer 94 will now be described. According to the method, the second photoresist layer 94 is laminated adjacent the imaged and developed thick film layer 80 (FIG. 10). The second photoresist layer 94 may be laminated to the thick film layer 80 using heat and pressure. Next a mask 96 is used to define the nozzles 98 in the second photoresist layer 94. As described above, the mask 96 includes transparent areas 100 and opaque areas 102 defining the nozzles 98 in the photoresist layer 94. The opaque areas 102 prevent actinic radiation indicated by arrow 104 from contacting the second photoresist layer 94 in an area which will provide the nozzle 98, while the remainder of the second photoresist layer 94 is cured by the actinic radiation. Upon developing the second photoresist layer 94 with a suitable solvent as described above, the nozzles 98 are formed in the second photoresist layer as shown in FIG. 11. Conventional photoimaging and developing techniques as described above are use to image and develop the second photoresist layer 94.

After developing the second photoresist layer 94, the substrate 12 containing the layer 80 and the layer 94 is optionally baked at temperature ranging from about 150° C. to about 200° C., such as from about from about 170° C. to about 190° C. for about 1 minute to about 60 minutes, such as from about 15 to about 30 minutes.

Having described various aspects and exemplary embodiments and several advantages thereof, it will be recognized by those of ordinary skills that the disclosed embodiments is susceptible to various modifications, substitutions and revisions within the spirit and scope of the appended claims.

What is claimed is:

1. An improved photoimageable nozzle member for a micro-fluid ejection head, comprising a negative photoresist composition derived from a composition comprising a first di-functional epoxy compound, a high molecular weight polyhydroxy ether devoid of epoxy group, a photoacid generator devoid of aryl sulfonium salts, an adhesion enhancer, and an aliphatic ketone solvent, wherein the nozzle member has a thickness ranging from about 10 microns to about 30 microns.

2. The nozzle member of claim 1, wherein the photoacid generator comprises a diaryliodonium hexafluoroantimonate.

3. The nozzle member of claim 1, wherein the di-functional epoxy compound comprises substantially equal parts of the first di-functional epoxy compound and a second di-functional epoxy compound having a weight average molecular weight lower than a weight average molecular weight of the first di-functional epoxy compound.

4. The nozzle member of claim 1, wherein the nozzle member comprises from about 20 to about 30 percent by weight of the first difunctional epoxy compound, from about 20 to about 30 percent by weight of the second difunctional epoxy compound, from about 15 to about 25 percent by weight photoacid generator, from about 20 to about 40 percent by weight polyhydroxy ether, and from about 0.05 to about 1.5 percent by weight adhesion enhancer.

5. The nozzle member of claim 1, wherein the aliphatic ketone solvent comprises cyclohexanone, and optionally, acetone.

6. The nozzle member of claim 1, wherein the adhesion enhancer comprises an alkoxysilane compound.

7. The nozzle member of claim 6, wherein the methoxysilane compound comprises gamma-glycidoxypropyltrimethoxysilane.

8. A micro-fluid ejection head structure including the nozzle member of claim 1.

9. A micro-fluid ejection device comprising the micro-fluid ejection head of claim 8.

10. A micro-fluid ejection head comprising a substrate having a device surface, the ejection head comprising:

a photoimaged and developed thick film layer applied adjacent the device surface of the substrate, the thick film layer comprising a first negative photoresist layer derived from a composition comprising a multi-functional epoxy compound, a first difunctional epoxy compound, a photoacid generator devoid of aryl sulfonium salts, an adhesion enhancer, and an aryl ketone solvent, a photoimaged and developed nozzle member adjacent the imaged and developed thick film layer, the photoimaged and developed nozzle member comprising a second photoresist layer derived from a composition comprising the first di-functional epoxy compound, a second di-functional epoxy compound, a high molecular weight polyhydroxy ether devoid of epoxy group, the photoacid generator devoid of aryl sulfonium salts, the adhesion enhancer, and an aliphatic ketone solvent, wherein the nozzle member has a thickness ranging from about 10 microns to about 30 microns.

11. The micro-fluid ejection head of claim 10, wherein the photoacid generator comprises a diaryliodonium hexafluoroantimonate.

12. The micro-fluid ejection head of claim 10, wherein the adhesion enhancer comprises gamma-glycidoxypropyltrimethoxysilane, and the second negative photoresist layer includes substantially equal parts of the first di-functional epoxy compound and the second di-functional epoxy compound.

13. An improved photoimageable nozzle member for a micro-fluid ejection head, comprising a negative photoresist composition derived from a composition comprising a first di-functional epoxy compound, a second di-functional epoxy compound, a high molecular weight polyhydroxy ether devoid of epoxy group, a photoacid generator devoid of aryl sulfonium salts, an adhesion enhancer, and an aliphatic ketone solvent, the composition having at least two of the following properties: an image resolution of greater than about 10 microns; an aspect ratio of less than about 2:1; and b-staged film properties of about 20% to about 200% elongation and a Young's Modulus of about 10 to about 500 MPa.

* * * * *

UNITED STATES PATENT AND TRADEMARK OFFICE

CERTIFICATE OF CORRECTION

PATENT NO. : 7,654,637 B2
APPLICATION NO. : 11/361732
DATED : February 2, 2010
INVENTOR(S) : Weaver et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 847 days.

Signed and Sealed this

Twenty-eighth Day of December, 2010

David J. Kappos

*Director of the United States Patent and Trademark Office*